(12) United States Patent
Nelson et al.

(10) Patent No.: US 7,041,374 B1
(45) Date of Patent: May 9, 2006

(54) POLYMER MATERIALS WITH ELECTROSTATIC DISSIPATIVE PROPERTIES

(76) Inventors: Gordon L. Nelson, 2283 Hamlet Dr., Melbourne, FL (US) 32934; Nahid Najafi-Mohajeri, 4641 Cherdonmay Dr., Rockledge, FL (US) 32955

( * ) Notice: Subject to any disclaimer, the term of this patent is extended or adjusted under 35 U.S.C. 154(b) by 0 days.

(21) Appl. No.: 10/114,896

(22) Filed: Apr. 1, 2002

Related U.S. Application Data

(60) Provisional application No. 60/280,015, filed on Mar. 30, 2001.

(51) Int. Cl.
| | |
|---|---|
| B32B 27/00 | (2006.01) |
| B32B 27/32 | (2006.01) |
| B32B 27/40 | (2006.01) |
| B32B 33/00 | (2006.01) |
| H01B 1/12 | (2006.01) |

(52) U.S. Cl. .................. 428/411.1; 428/423.1; 428/474.4; 428/480; 428/523; 528/9; 252/500

(58) Field of Classification Search ............ 428/423.1, 428/425.8, 425.5, 411.1, 474.4, 480, 523; 528/9; 252/500
See application file for complete search history.

(56) References Cited

U.S. PATENT DOCUMENTS

| | | | | |
|---|---|---|---|---|
| 4,255,466 | A | * | 3/1981 | Natsume et al. ............ 427/113 |
| 4,288,352 | A | | 9/1981 | Weiss et al. |
| 4,307,144 | A | * | 12/1981 | Sanders et al. ............... 442/38 |
| 4,622,257 | A | * | 11/1986 | Thompson .................. 428/143 |
| 4,634,865 | A | | 1/1987 | Conway |
| 4,675,221 | A | * | 6/1987 | Lalikos et al. .............. 138/110 |
| 4,804,582 | A | | 2/1989 | Noding et al. |
| 5,232,775 | A | | 8/1993 | Chamberlain et al. |
| 5,736,469 | A | | 4/1998 | Bhattacharjee et al. |
| 5,834,116 | A | * | 11/1998 | Sawa et al. ................. 428/375 |
| 5,955,526 | A | | 9/1999 | Spicher |
| 6,037,091 | A | * | 3/2000 | MacLeod et al. ....... 430/111.32 |
| 6,177,540 | B1 | | 1/2001 | Harlan et al. |

OTHER PUBLICATIONS

Encyclopedia of Polymer Science and Engineering, vol. 1: Additives, pp. 472-475, Aug. 1985.*
Abd-Alla, M.M et al., "Arylidene Polymers. XVIII. Synthesis and Thermal Behavior of Organometallic Arylidene Polyesters Containing Ferrocene Derivatives in the Main Chain" *J. Applied Polymer Sci.*, 1993, 47:323-329.
Casado, C.M. et al., "Siloxane and Organosilicon Dimers, Monomers, and Polymers with Amide-Linked Ferrocenyl Moieties. Synthesis, Characterization, and Redox Properties" *Inorg. Chem.*, 1995, 34:1668-1680.

(Continued)

*Primary Examiner*—Ramsey Zacharia
(74) *Attorney, Agent, or Firm*—Saliwanchik, Lloyd & Saliwanchik

(57) ABSTRACT

A method for modifying the electrostatic discharge (ESD) characteristics of a polymeric material by integrating metallocene moieties as constituents of the polymer structure. In a preferred embodiment, the metallocene is part of the polymer backbone structure. In another preferred embodiment, the metallocene moieties are in sufficiently close proximity to one another such that electrostatic charge propagation is promoted. In another preferred embodiment, the metallocene is ferrocene. In another embodiment, an article is formulated from, or coated with, a polymeric composition containing metallocene as a polymer constituent. The subject invention includes novel polymeric compositions. Polymeric compositions of the subject invention, and articles made therefrom, exhibit electrostatic dissipative properties which are useful in preventing destructive electrostatic discharge.

38 Claims, 9 Drawing Sheets

$X \geq 1$ $X_1$ and $x_2$ can be a variety of groups

OTHER PUBLICATIONS

Gonsalves, K.E. and M.D. Rausch, "Segmented Poly(ether Urethane) Films Containing Ferrocene Units in the Hard Segments" *J. Polymer Science: Part A: Polymer Chem.*, 1986, 24:1599-1607.

Gonsalves, K. et al., "Ferrocene-Containing Polyamides and Polyureas" *J. Am. Chem. Soc.*, 1984, 106:3862-3863.

Hale, P.D. et al., "A New Class of Amperometric Biosensor Incorporating a Polymeric Electron-Transfer Mediator" *J. Am. Chem. Soc.*, 1989, 111:3482-3484.

Kishore, K. et al., "Synthesis, Characterization, and Fire Retardancy of Ferrocene Containing Polyphosphate Esters" *J. Polymer Science: Part A: Polymer Chem.*, 1991, 29:1039-1044.

Najafi-Mohajeri, N. et al., "Synthesis and Properties of New Ferrocene-Modified Urethane Block Copolymers" *J. Applied Polymer Sci.*, 2000, 76:1847-1856.

Najafi-Mohajeri, N., "New Polyurethane Block Copolymers Containing a Ferrocene Moiety: Synthesis, Characterization, Thermal, and Flammability Properties," May 1999, Ph.D. dissertation, Florida Institute of Technology (Melbourne, FL), pp. 1-10, 85-97, and 109-113.

Wright, M.E. and E.G. Toplikar, "Organometallic Nonlinear Optical Polymers. 2. Synthesis of Main-Chain Organometalic Polymers and a Structural Study of Ferrocene NLO-phores" *Macromolecules*, 1992, 25:6050-6054.

Wright, M.E. and M.S. Sigman, "Organometallic Nonlinear Optical Polymers. 3. Copolymerization of Bridged Bis(ferrocenyl) and Bis(cyanoacetate) Monomers via the Knoevenagel Condensation" *Macromolecules*, 1992, 25: 6055-6058.

Najafi-Mohajeri, N. and G.L. Nelson "Cyclic voltammetry properties of ferrocene-modified block copolyurethanes" *Polymer*, Jul. 2001, 42:7221-7224.

Najafi-Mohajeri, N. "New polyurethane block copolymer containing ferrocene moiety: Synthesis, characterization, thermal, and flammable properties", May 1999, Ph.D dissertation, Florida Institute of Technology, Melbourne, FL, pp. i-xxvii and pp. 1-160.

Table of contents of vol. 76, issue 13 of the Journal of Applied Polymer Science; printed from Wiley InterScience web site.

Bu, H-Z et al. "Charge transport in ferrocene-containing polyacrylamide-based redox gels" *J. Phys. Chem. B.*, 1997, 101:9593-9599.

Dement'ev, V.V. et al. "Structure and electrochemistry of ferrocenyloligosilanes: $\alpha,\omega$-bis(ferrocenyl)- and $\alpha,\omega$-(1,1'-ferrocenediyl)oligosilanes" *Organometallics*, 1993, 12: 1983-1987.

Dong, T-Y. et al. "Electron transfer in mixed-valence 1,1, 12,12-tetra-n-butyl[1,1]stannaferrocenophane: Electrochemical and near-IR spectroscopic studies" *J. Organometallic Chem.*, 1990, 391:377-385.

Flanagan, J.B. et al. "Electron transfer to and from molecules containing multiple, noninteracting redox centers. Electrochemical oxidation of poly(vinylferrocene)" *J. Amer. Chem. Soc.*, 1978, 100:4248-4253.

Foucher, D.A. et al. "Organometallic ferrocenyl polymers displaying tunable cooperative interactions between transition metal centers" *Angew. Chem. Int. Ed. Engl.*, 1993, 32(12):1709-1711.

Mueller-Westerhoff, U.T. "[m.m]Metallocenophanes: Synthesis, structure, and properties" *Angew. Chem. Int. Ed. Engl.*, 1986, 25:702-717.

Nelson, J.M. "Thermal ring-opening polymerization of Hydrocarbon-bridged [2]ferrocenophanes: synthesis and properties of poly(ferrocenylethylene)s and their charge-transfer polymer salts with tetracyanoethylene" *Chem. Eur. J.*, 1997, 3(4):573-584.

Nguyen, M.T. and A.F. Diaz "Electrochemical and electrochromic properties of poly(dialkylsilyleneferrocenylene) films" *Chem. Mater.*, 1994, 6:952-954.

Smith, T.W. et al. "Voltammetric behavior of poly(vinylferrocene)" *J. Poly. Sci.*, 1976, 14:2433-2448.

* cited by examiner

| Sample ID | Composition | max V | Discharge Time |
|---|---|---|---|
| NN.1.65 | Control | 1000+ | 17s to 100V |
| NN.1.076 | ME-080, HDO, FCOH (10%) | 500 | 30s to 0V |
| NN.1.73 | ME-080, HDO, FCOH (15%) | 300 | Instant to 0V |
| NN.2.31 | ME-080, HDO, FCNH$_2$ (5%) | 700 | 8s to 0V |
| NN.2.37 | ME-080, HDO, FCNH$_2$ (3%) | 700 | Instant to 0V |

FIG. 1A

| Sample ID | Composition | max V | 500ms | 1.0s | 2.0s | 3.0s | 4.0s | 5.0s |
|---|---|---|---|---|---|---|---|---|
| NN.2.51 | ME-080, HDO (Control) | 20000+ | 20000+ | 20000+ | 17770 | 15440 | 13470 | 11840 |
| NN.2.47 | ME-080, HDO, Ferrocene (10%) | 15770 | 15070 | 14110 | 12730 | 11590 | 10610 | 9750 |
| NN.2.42 | ME-080, HDO, FCOH (2%) | 13790 | 12210 | 9480 | 6220 | 4250 | 2970 | 2110 |
| NN.2.48 | ME-080, HDO, FCOH (5%) | 650 | 50 | 20 | <20 | | | |
| NN.2.49 | ME-080, HDO,FCOH (10%) | 7970 | 3440 | 440 | 70 | 60 | 60 | 60 |
| NN.2.50 | ME-080, HDO, FCOH (15%) | 50 | 50 | 50 | 50 | 50 | 50 | 50 |

FIG. 1B

POLYMER MATERIALS WITH ELECTROSTATIC DISSIPATIVE PROPERTIES

CROSS-REFERENCE TO RELATED APPLICATION

This application claims the benefit of provisional patent application Ser. No. 60/280,015, filed Mar. 30, 2001.

FIELD OF THE INVENTION

The subject invention pertains to compositions useful as electrostatic dissipative agents and methods for making and using such compositions.

BACKGROUND OF THE INVENTION

Plastic materials have a tendency to accumulate static electrical charges due to low electrical conductivity. Friction between dissimilar electrical insulators can generate significant static charge in a short period of time (i.e., triboelectric charging). Floor surfaces, particularly in a manufacturing area, are subject to such charge generation by virtue of the movement of material and people handling equipment.

This static charge is undesirable for a variety of reasons, including dust attraction, interference with processing during fabrication of the final product, and spark generation from static buildup, which can produce serious accidents such as fire or explosion.

The increasing complexity and sensitivity of microelectronic devices make the control of static discharge of particular concern to the electronic industry, such as integrated circuit (IC) and semiconductor equipment manufacture. Even a low voltage discharge can destroy or cause a latent defect in an electronic component. These adverse effects are often seen when the electronic component is a solid state electronic device, such as a computer chip, which contains several semiconductive layers. Due to miniaturization and assignment of many functions to a single chip, the semiconductor layers are required to be very thin. Thus, even relatively small electrostatic discharges of less than 500 V can burn through the semiconductor layer and induce latent defects in, or completely destroy the functionality of, the semiconductor layer.

Keys to controlling electrostatic discharge (ESD) include the use of grounding equipment and/or the elimination of static-generative materials. The latest technology incorporates inherently static-dissipative and anti-static polymers. An advantage to using polymers for ESD protection is that they can be tailored to a desired range of surface and volume resistivity, so as to be able to "bleed off" or dissipate any occurring static charge. The resistivity must not be so low as to allow the charge to move too quickly through material, thereby causing an arc or spark. On the other hand, the resistivity must not be so great as to cause the charge to build up to such a high level as to ultimately cause a sudden discharge (spark or arc).

The need to control electrostatic charge buildup and dissipation often requires the entire electronic assembly environment to be constructed of partially conductive polymers. It also may require electrostatic protective packaging, tote boxes, holders, housings, casings, and covers be made from conductive polymeric materials to store, ship, protect, or support electrical devices and equipment. It is estimated that plastics used in electric devices will increase in both dollar volume and types of applications they serve. For instance, sales of these materials will grow from $251 million dollars in 1987 to an estimated $768 million in 2001. Poundage is expected to increase accordingly, from 250 million to 767 million pounds over the same period.

Dissipation of electric charge from polymer surfaces is often accomplished by the addition of various conductive chemicals, but these chemicals often have short life spans or toxic constituents. Another mode of imparting some electrostatic charge dissipation to polymers involves placing conductive filler particles or dopants (hereinafter, "additives") into a continuous polymer phase by blending the particles with the host polymer as it is extruded or otherwise processed. These additives are disclosed in several patents, e.g., U.S. Pat. Nos. 4,288,352; 4,634,865; 4,804,582; 5,232,775; and 5,955,526. Such additives include tin, lead, silver, copper, gold, carbon powder or fibers, nickel coated carbon fibers, stainless steel fibers, and ceramic materials. However, these technologies have several manufacturing and performance limitations. For example, the levels of additive that are required to provide sufficient conductivity for dissipating the electrical charge are very high, as much as 30% by weight. While blending conductive additives such as graphite and metals with a host polymer can increase conductivity and produce a dissipative solution, the finished product can suffer from a reduction in physical strength and inconsistent performance due to non-uniform distribution. Another problem associated with conductive additives is migration. At high temperatures (e.g., during processing or in field conditions), conductive additives tend to migrate to the surface of the polymer composition, which has a negative impact on both physical characteristics and ESD characteristics.

One conductive additive that has been blended with a base polymer to impart electrostatic dissipative properties is ferrocene. As a member of the metallocene family, each ferrocene molecule is composed of a metal atom bounded by two cyclopentadienyl rings. In the case of ferrocene, the metal center is iron.

Polymeric materials which contain organometallic moieties have become a subdiscipline of polymer chemistry. The ferrocene unit, for example, has proven itself to be a versatile building block, possessing very useful properties including high thermal stability, radiation resistance, and electroconduction properties.

Ferrocene moieties have been incorporated as a constituent of polymers as pendant groups, connected to the polymer chain by one functionality, and as integral polymeric units, connected to the polymer chain by two functionalities. For example, segmented poly(ether urethane) films containing ferrocene units in their hard segments have been developed (Gonsalves et al. (I), 1986), as well as ferrocene-modified urethane block copolymers (Najafi-Mohajeri et al., 2000). Such ferrocene polymers have been used previously in a variety of applications, such as catalysts, flame retardants, and photosensitizers (Gonsalves et al. (II), 1984; Hale et al., 1989; Kishore et al., 1991; Wright et al. (I), 1992; Wright et al. (II), 1992; Abd-Alla et al., 1993; Casado et al., 1995; and Najafi-Mohajeri, 1999). However, the ESD behavior of polymers containing a ferrocene moiety as a constituent of the polymer structure (as opposed to its use as an additive) has never been evaluated.

Accordingly, there remains a need for polymer compositions that exhibit electrostatic dissipative properties without the disadvantages associated with conventional dissipative polymers, which utilize conductive additives.

BRIEF SUMMARY OF THE INVENTION

The subject invention relates to electrostatic dissipative polymeric compositions comprising metallocene moieties incorporated as a constituent of the polymer structure.

The subject invention is at least partly based on the surprising discovery that polymers containing metallocene moieties within their polymer structure exhibit ESD behavior that render them useful for a variety of applications where control of ESD is desirable. In a preferred embodiment, the polymer contains multiple metallocene moieties in sufficiently close proximity to one another so as to promote charge propagation (i.e., a pathway for electrons). In another preferred embodiment, the metallocene moiety is ferrocene.

Preferably, the percent content of metallocene within the base polymer or polymers is about 1% to about 20%, by molecular weight. More preferably, the percent content of metallocene is about 2% to about 15%, by molecular weight. Most preferably, the percent content of metallocene is about 3% to about 10%, by molecular weight. Preferably, the metallocene is ferrocene.

In addition, the polymeric compositions of the subject invention can be incorporated or blended with other polymeric materials as a composite, and used where electrostatic discharge potential exists.

The subject invention also concerns methods for modifying the ESD characteristics of a polymer by incorporating metallocene moieties in close proximity to one another within the polymer structure. Preferably, the metallocene moieties are incorporated as part of the polymer backbone structure.

The subject invention also concerns methods for modifying the ESD characteristics of a substrate by coating the substrate with a polymer having metallocene moieties incorporated as constituents of the polymer structure. The subject invention also includes electrostatic dissipative compositions which are novel in structure.

The subject invention also concerns articles having modified ESD characteristics and methods for making such articles.

BRIEF DESCRIPTION OF THE DRAWINGS

FIG. 1A shows the peak triboelectric voltage and discharge time exhibited by ferrocene-modified polyurethanes, an unmodified polyurethane, and a polyurethane containing ferrocene as an additive.

FIG. 1B shows the electrostatic charge decay exhibited by ferrocene-modified polyurethanes, an unmodified polyurethane, and a polyurethane containing ferrocene as an additive.

DETAILED DISCLOSURE OF THE INVENTION

The subject invention includes a process for preparing an electrostatic dissipative polymeric composition comprising the steps of adding to a base polymer composition an effective amount of a metallocene monomer under polymerization conditions. In a preferred embodiment, the metallocene is ferrocene and the ferrocene oligomer is either amine or hydroxyl terminated.

The subject invention also provides a method of modifying the ESD characteristics of a polymer by incorporating metallocene units as constitutional units of the polymer. Preferably, the metallocene units are arranged in close proximity to one another, so as to interact and promote charge propagation. More preferably, the metallocene units are part of the polymer backbone structure. As used herein, the term "backbone" or "backbone structure" refers to the polymer chain to which all other chains may be regarded as being pendant.

The metal moieties within the metallocene can be selected from among any of the transition metals. For example, metallocenes embodied in this invention are those whose metals include, but are not limited to, iron, molybdenum, ruthenium, osmium, nickel, vanadium, rhenium or technetium. Metal moieties within each metallocene unit may be the same metal or different metals selected individually from among the transition metals.

The data in FIGS. 1A and 1B show that the incorporation of ferrocene within the backbone structure of the base polymer has a superior and surprising effect on ESD behavior, as compared to ferrocene when used as a conductive additive. These data also show that, by changing the percentage of the ferrocene content, one skilled in the art can tailor the polymer to the desired range of surface and volume resistivity. Therefore, using the methods described herein, as well as alternative methods known to those skilled in the art (e.g., static decay testing), the ESD characteristics of a particular polymeric composition can be varied and preselected, depending upon the needs of the producer. Specifically, by including a sufficient number of metallocene units within the polymer structure, and tailoring the proximity of the metallocene units to one another, the surface and volume resistivity exhibited by a particular polymeric composition can be selected from among a range of resistivities, from anti-static to conductive.

In a preferred embodiment of a polymeric composition of the invention, the percent content of metallocene within the base polymer or polymers can range from about 1% to about 20%, by molecular weight. More preferably, the percent content of metallocene is from about 2% to about 15%, by molecular weight. Most preferably, the percent content of metallocene is from about 3% to about 10%.

Figure 2:
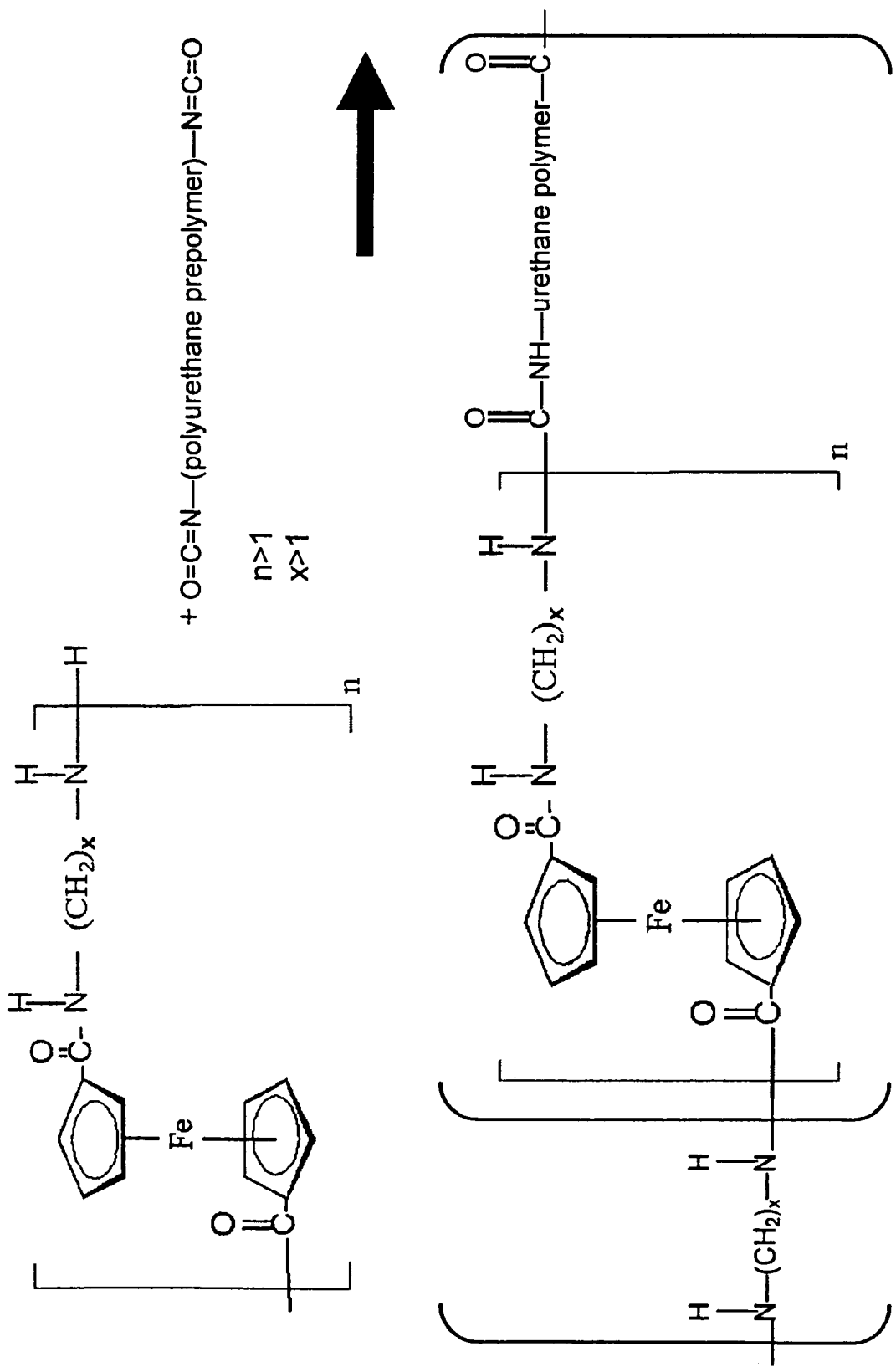
FIG. 2 shows a reaction scheme where an amine terminated ferrocene oligomer is reacted with an isocyanate to yield a polyurea.
Figure 3:
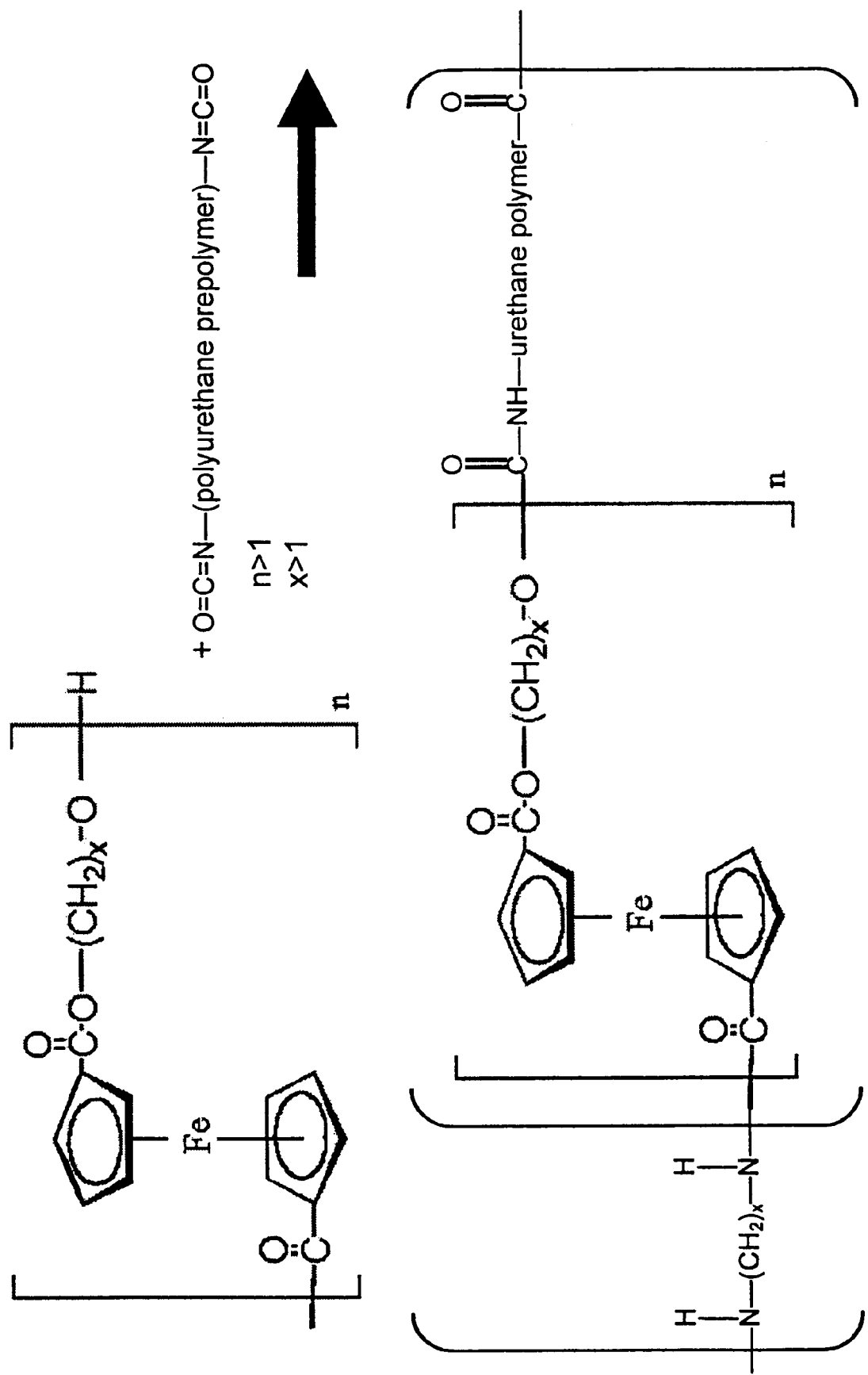
FIG. 3 shows a reaction scheme where a hydroxyl terminated ferrocene oligomer is reacted with an isocyanate to yield a polyurethane.
Figure 4:
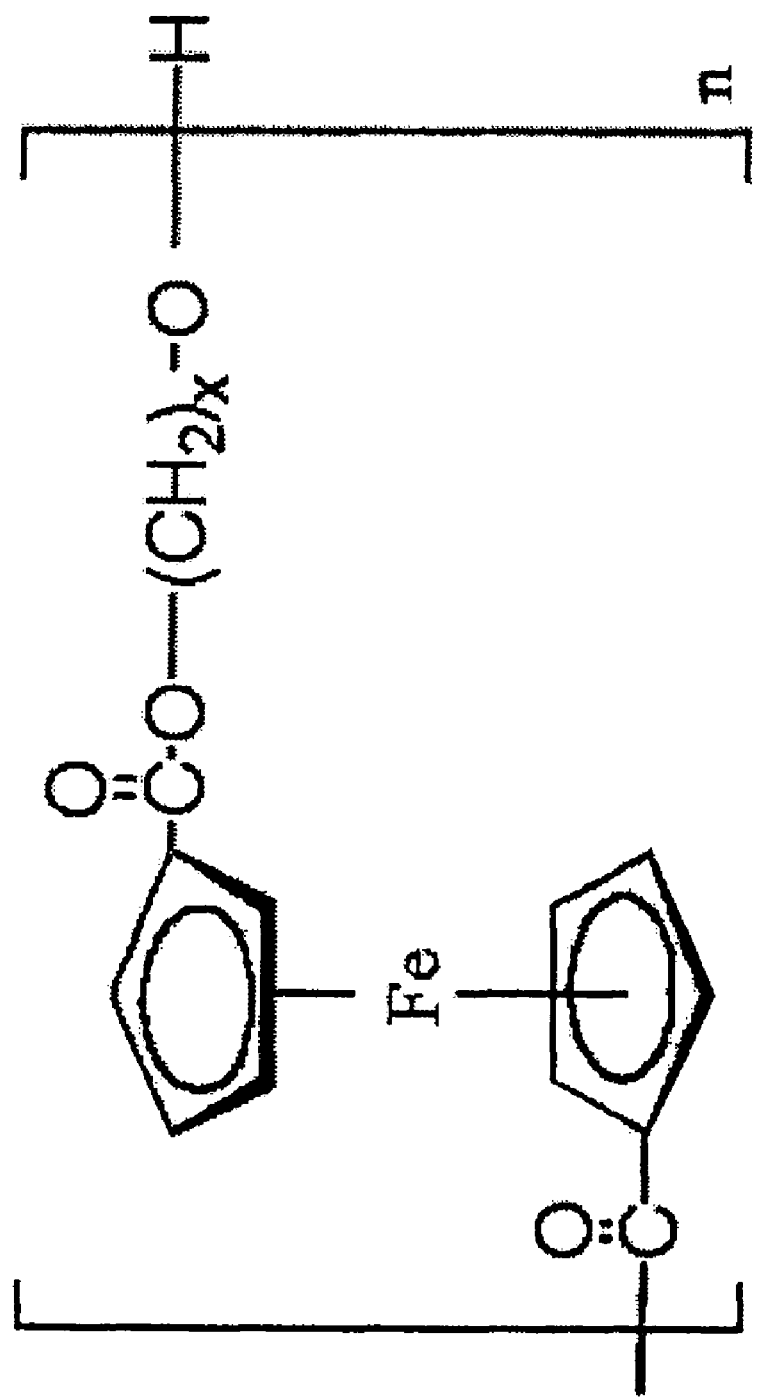
FIG. 4 shows a hydroxyl terminated ferrocene oligomer.
Figure 5:
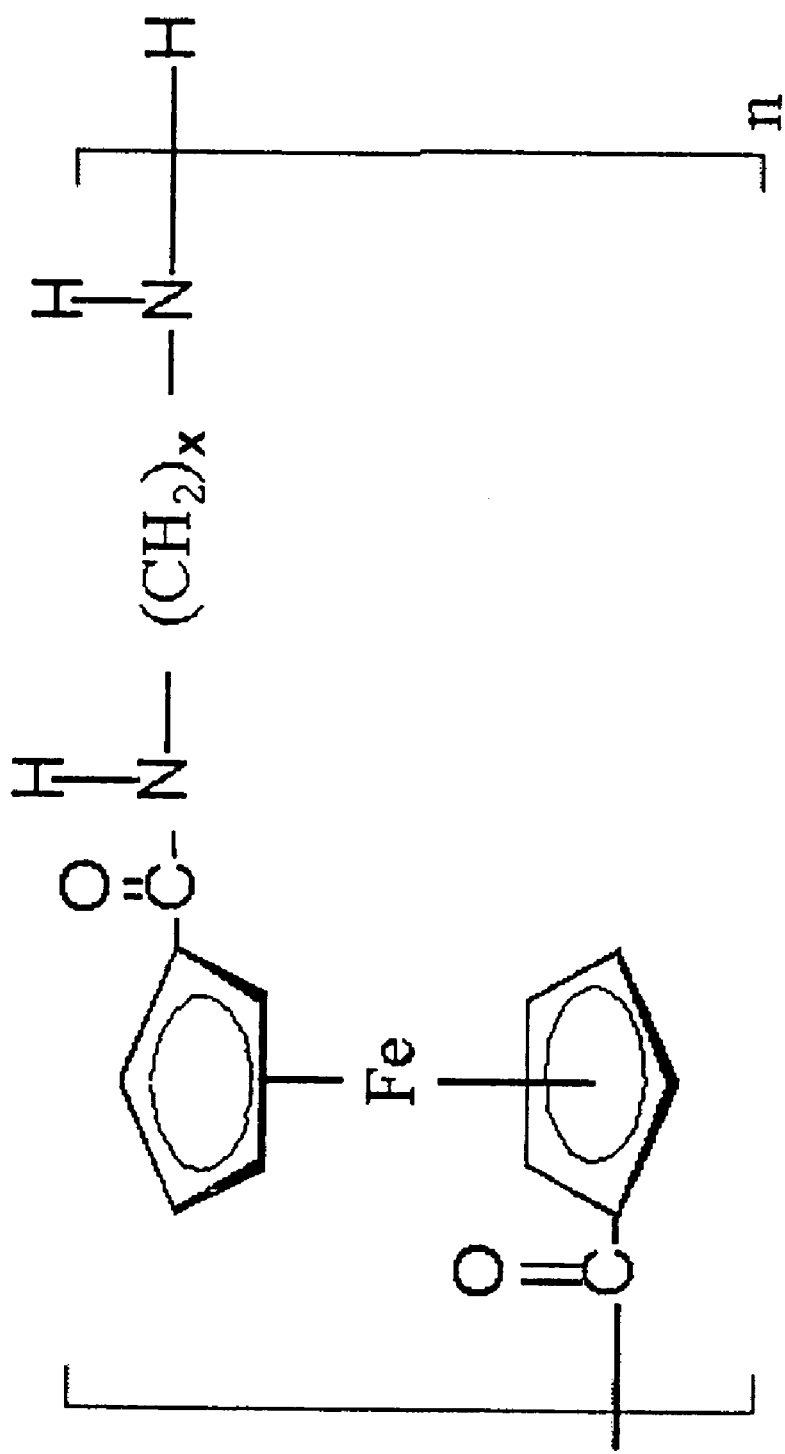
FIG. 5 shows an amine terminated ferrocene oligomer.
Figure 6:
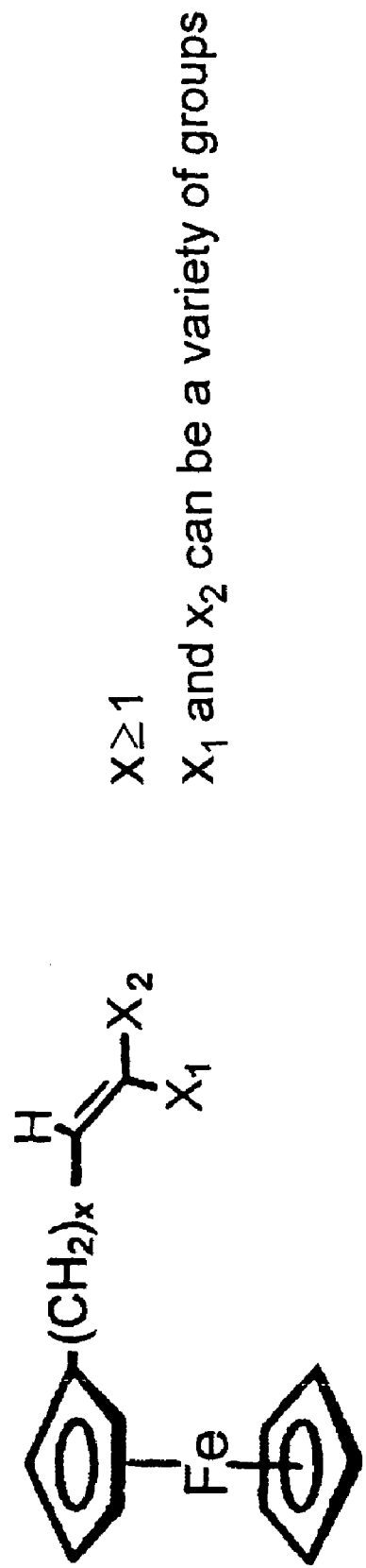
FIG. 6 shows a ferrocene oligomer that can be used in chain growth polymers to create ferrocene-containing polyolefins.

The polymeric compositions of the subject invention can be produced from potentially any polymerization reaction, such as condensation polymerization reactions or step growth polymerization reactions. In exemplified embodiments, an amine terminated ferrocene oligomer can be reacted with an isocyanate to yield a polyurea, as shown in FIG. 2, and a hydroxyl terminated ferrocene oligomer can be reacted with an isocyanate to yield a polyurethane, as shown in FIG. 3. The ferrocene oligomer shown in FIG. 4 can be reacted with a dicarboxylic acid or a diacid chloride to yield a polyester. The ferrocene oligomer shown in FIG. 5 can be reacted with a dicarboxylic acid or a diacid chloride to yield a polyamide. Alternatively, the ferrocene oligomer shown in FIG. 5 can be reacted with an anhydride to yield a polyimide. The use of chain growth copolymers is also contemplated in the methods of the invention. For example, the ferrocene oligomer shown in FIG. 6 can be used in chain growth polymers to create ferrocene-containing polyolefins.

As shown in FIGS. 2 through 5, the "x" variable describing the number of hydrocarbons can be any value greater than one. In a preferred embodiment, the "x" variable is between 2 and 8. As previously described, it should be readily apparent to the skilled artisan to tailor the content and frequency of the metallocene and non-metallocene moieties within the polymer structure to achieve the desired ESD characteristics, as well as other desired properties.

In the case of polyurethanes and polyurea, for example, the "prepolymer" method can be used, where diphenyl-methane-4,4'-diisocyanate (MDI) and polytetramethylene ether glycol (PTMEG) are reacted first, to form a prepolymer. Alternatively, the "one shot" method can be used, which connotes that the reactants (e.g., isocyanate, polyol, and metallocene oligomer) are all added to the reaction at the same time with a catalyst to make a polymer. However, if one begins with a prepolymer and mixes the prepolymer with a metallocene oligomer, a diol, and a catalyst, this technique could be described as "one shot" as well.

Polymers which incorporate more than one type of monomer into their chain are called copolymers, as opposed to homopolymers which are made up of one species of monomer. By definition, the polymeric compositions of the subject invention comprise a copolymer (e.g., monomeric units of metallocene polymerized with at least one other type of monomer). The polymeric compositions of the subject invention can comprise various types of copolymers, such as alternating copolymers, where a metallocene monomer and another type of monomer are arranged in an alternating fashion. The polymeric compositions of the subject invention can include random copolymers, where metallocene monomers are arranged in no particular sequential order. In a preferred embodiment, the polymeric compositions of the subject invention comprise block copolymers, which contain blocks of monomer units of the same type (e.g., metallocene). Alternatively, as a graft copolymer, one or more monomeric units of one type (e.g., metallocene) can be grafted (as a side chain) to a main polymer chain containing another type, or types, of monomer. The oligomers involved in the polymerization reactions (e.g., ferrocene oligomer) can be virtually any length, containing any workable number of monomeric units (monomer molecules). Therefore, the subject invention can involve any degree of polymerization.

In the case of polyureas and polyurethanes, a variety of conventional chain extenders, such as diols and diamines, can also be used in preparing polymeric compositions of the invention. Conventional chain extenders are molecules having two functional groups (reactive sites) which will react with the reactive moieties of the polymers. The reactive moieties are typically present at the ends of the polymer oligomers as a result of routine synthesis, but the reactive moieties can be located at locations other than the ends. These reactive moieties can be hydroxyl (OH) groups or amine ($NH_2$) groups, but can include any of several other reactive groups which can then react with another functional group on the chain extender.

Suitable diisocyanates (either aliphatic or aromatic) include, for example, 1,4-diisocyanatobenzene (PPDI), 4,4'-methylenebis(phenyl isocyanate) (MDI), 4,4'-methylenebis (3-methoxy phenyl isocyanate), 1,5-napthalene diisocyanate (NDI), toluene diisocyanate (TDI), m-xylene diisocyantate (XDI), 1,4-cyclohexyl diisocyuanate (CHDI), 1,10-diisocyanatonaphthylene, and 4,4'-methylenebis(cyclohexyl isocyanate).

Metallocene prepolymers used to make polymeric compositions of the invention can include metallocene units and an aliphatic spacer (e.g., hexane diol). The percentages in FIGS. 1A and 1B refer to the percentage of ferrocene-rich prepolymer (based on molecular weight) used in experiments conducted with polymeric compositions of the invention. As described in Example 5, the prepolymer was composed of approximately 75% to 80% ferrocene, based on molecular weight. However, the metallocene prepolymer could include any percentage of metallocene, preferably from 25% to 100% metallocene, by molecular weight. Such variables can be readily modified by a person skilled in the art.

Various conventional additives can be used with the polymeric compositions of the subject invention. For example, heat stabilizers, fillers, pigments, colorants, lubricants, fire retardants, antioxidants, UV inhibitors, and processing aids generally employed for use in polymers can be included. In addition, plasticizers, such as those typically used and known to one skilled in the art can also be utilized. Various fillers include clays and calcium carbonate. Pigments include titanium dioxide. The amounts and types of additives, fillers and/or pigments that can be included are well known to those skilled in the art.

The polymeric compositions of the subject invention are suitable for use in a wide variety of applications where electrostatic dissipation is desired. Articles which can be formulated from, or coated with, the polymeric compositions of the subject invention include, for example, floor surfaces and finishes, table tops, textile fabrics, floor coverings (such as carpets, rugs, runners, pads, and mats), pillows, stretcher pads, seat coverings, adhesive tape, clothing, and furniture, such as chairs, tables, workbenches, cabinets, drawers, and shelves. Other examples of articles include conveyor means (e.g., conveyor belts and conveyor belt rollers), delivery trucks and carts, and tools (e.g., tweezers).

Other examples of articles which can be formulated from, or coated with, the polymeric compositions of the subject invention include packaging for electronic components, as well as tubes, bags, boxes, carriers, containers, packages, machine casings, and covers.

Various devices are used to store, transport, and/or otherwise support electronic components (e.g., carriers, wafer boats and wafer jars). These devices are typically utilized for transporting batches of silicon wafers or magnetic disks before, during, and after processing of the disks or wafers. The wafers are processed into integrated circuits and the disks are processed into magnetic storage disks for computers. Such support devices are typically formed of injection molded plastics, such as polycarbonate (PC), acrylonitrile butadiene styrene (ABS), polypropylene (PP), polyethylene (PE), and polyetheretherketone (PEEK). Despite the presence of conductive additives blended in with the base polymer or polymers, conventional support devices are prone to ESD, which can disrupt/damage an integrated circuit. In addition, the mere build up of static charge can attract particles (e.g., dust) that can contaminate an integrated circuit. It is most desirable, therefore, to have a support device with static dissipation characteristics to eliminate ESD and to avoid attracting particles. The polymeric compositions of the subject invention can be formulated into static dissipative support devices or applied as a static dissipative coating to such support devices, or other processing equipment.

Other articles that can be prepared or coated with polymeric compositions of the invention include, but are not limited to, electronic components such as transistors, circuit boards and through-hole plating of circuit boards, microprocessors, RAM (random access memory) and ROM (read only memory) components, disc drives, electrodes, lithographic resists, batteries, and antennas. Printer components, such as printer casings and paper transport rollers can also be prepared or coated with polymeric compositions of the subject invention.

Other articles that can be prepared or coated with polymeric compositions of the invention include those objects used in the vicinity of fuels, accelerants, and other flammable materials, where an electrostatic discharge is particularly dangerous, such as fuel pumps, pump handles, hoses, hose coverings, wands, nozzles, and other piping components. In the particular case of vehicle fuel pumps, other articles that may also contribute to an ESD event include vehicle seat upholstery, vehicle paneling (interior and exterior), and vehicle console components and instrumentation (e.g., steering wheel, gear shifter, stereo tuner). Therefore, these articles can be prepared or coated with the polymeric compositions of the subject invention.

The polymeric compositions of the subject invention, and articles made therefrom, can be formulated such that some areas of the composition or article exhibit greater electrostatic resistivity than other areas. For example, the composition or article could exhibit a gradient of increasing electrostatic resistivity across its surface.

The polymeric compositions of the subject invention can also be formulated into or coated on articles used in clean rooms, such as those products described in U.S. Pat. No. 5,736,469. Such articles include, for example, wipes, stationary products (e.g., notebooks and pens), garments (e.g., plastic gloves, footwear), and swabs (e.g., polyurethane tipped swabs).

The polymeric compositions of the subject invention can also be formulated into or coated on articles such as gaskets, seals, o-rings, diaphragms, gears, valves, bushings, bumpers, grommets, stoppers, bellows, plugs, vibration mounts, bearings, weather stripping, rollers, and tubing connectors.

Polymers that can be used to prepare the polymeric compositions of the invention include, but are not limited to, epoxies, urethanes, and thermoplastics, such as polyesters, polyethers, such as polyether sulfone and polyolefins such as polyethylene, ethylene-propylene copolymer, either random or block configuration, polypropylene-maleic acid anhydride, polystyrene, styrene-acrylonitrile copolymer, acrylonitrile-butadiene-styrene, poly(methyl methacrylate), ethylene vinyl acetate, ethylene-acrylic acid copolymer, vinyl chloride-propylene, polyisobutylene, polybutadiene, poly (vinyl chloride), and polytetrafluoroethylene. In addition to organic polymers having carbon backbone chains, the polymeric compositions of the subject invention can be made using inorganic polymers, such as silicones, polysilanes, polygermanes, polystannanes, and polyphosphazenes.

Coatings of the polymeric compositions of the invention can be applied as airless or aerosol sprays, for example. Coatings of the polymeric compositions of the invention can be applied to a variety of substrates, including, for example, metals, wood, fabrics, concrete, particle board, as well as other polymer materials.

In another aspect, metallocene derivatives can be used according to the subject invention. For example, in the case of ferrocene, derivatives such as acetyl ferrocene, benzoyl ferrocene, and n-butyl ferrocene can be used according to the subject invention. In another aspect, metallocene enantiomers can be used according to the subject invention.

Polymer chains within the polymeric compositions of the subject invention can be cross-linked to a degree appropriate for the particular application. For example, a polyisoprene can be lightly cross-linked for flexibility or heavily cross-linked as a permanent thermoset. Reversible cross-links are possible as well. Cross-linking agents are known to those skilled in the art and can be employed in carrying out the invention.

The polymer morphology of the polymeric compositions of the subject invention can be highly ordered (e.g., crystalized) or have little order (e.g., amorphous), or any range there between. The polymeric compositions of the subject invention can be formulated as coatings, films, foams, membranes, sheets, etc.

After a polymeric composition of the subject invention is produced, or during its production, it can be manipulated or processed into some useful shape or object, i.e., an article. The polymeric composition may be injection molded, which involves heating the polymeric composition above its glass transition temperature and forcing the composition under pressure to fill the contents of a mold. Alternatively, the polymeric compositions of the subject invention can be reaction injection molded (RIM), which is a processing technique for the formation of polymer parts by direct polymerization in the mold, using impingement mixing to combine reactive intermediates as they enter the mold. The polymeric compositions of the subject invention can also be formed by compression molding. Alternatively, the polymeric composition may be extruded through a die (as opposed to a mold), to form articles, or components of articles, having the same cross-sectional shape. To form fibers, the polymeric composition of the subject invention may be subjected to a spinning process, which involves pumping the molten composition through a spinneret. The polymeric compositions of the subject invention may also be blown, to form a film. The polymeric compositions of the subject invention can be poured or cast (e.g., as sheet or film). Essentially, the polymeric compositions of the subject invention can be produced through conventional plastic processing techniques which are appropriate for the particular polymer chemistry involved and known to the ordinarily skilled artisan.

All patents, patent applications, provisional applications, and publications referred to or cited herein are incorporated herein by reference in their entirety to the extent they are not inconsistent with the explicit teachings of this specification.

Following are examples which illustrate procedures, including the best mode, for practicing the invention. These examples should not be construed as limiting. All percentages are by weight and all solvent mixture proportions are by volume unless otherwise noted.

EXAMPLE 1

Ferrocene-Containing Hydroxyl Terminated (FCOH) Prepolymer Synthesis

Figure 7:
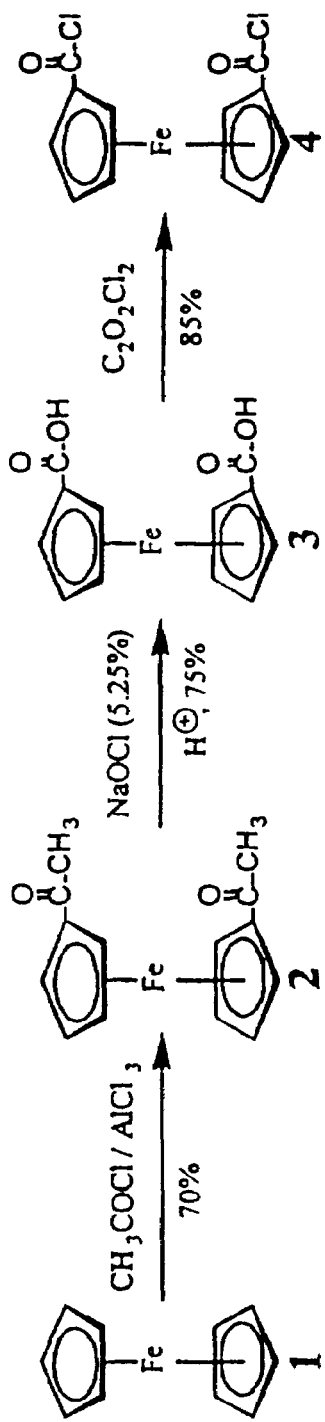
FIG. 7 shows a scheme for the synthesis of 1,1'-di(chlorocarbonyl) ferrocene.
Figure 8:
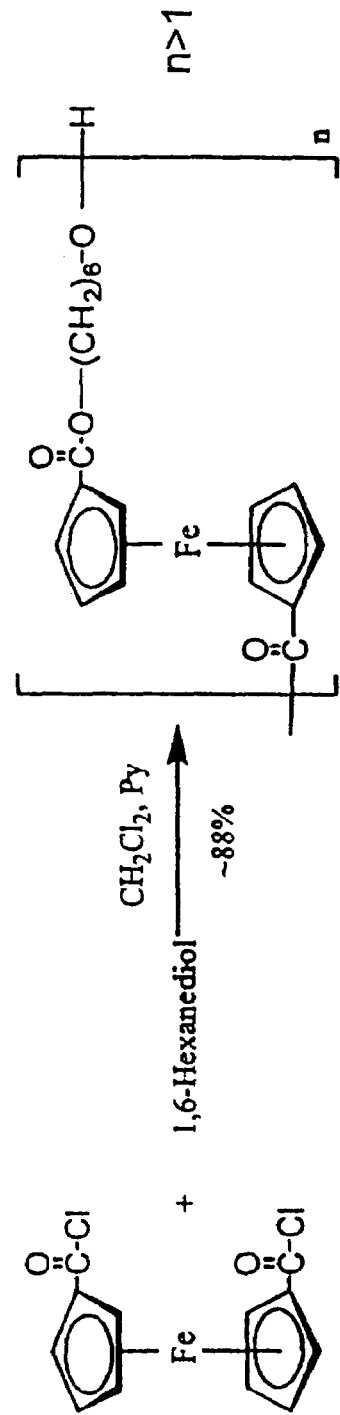
FIG. 8 shows a scheme for the synthesis of the ferrocene-containing hydroxyl terminated (FCOH) prepolymer.

A scheme for the synthesis of 1,1'-di(chlorocarbonyl) ferrocene is shown in FIG. 7. To the solution of 4.0 g (0.013 mole) 1,1'-di(chlorocarbonyl) ferrocene in dry benzene (95 ml), 1.82 g (0.0154 mole) 1,6-hexanediol and pyridine (1.1 ml) was added. The mixture was stirred at 70–75° C. under an inert atmosphere ($N_2$ gas) for 4 hours. The pyridinium chloride salt, being insoluble in benzene was precipitated from the reaction phase. The mixture was filtered and the solvent was evaporated under reduced pressure. The residue was extracted with $CH_2Cl_2$ and washed with water. The organic layer was dried ($Na_2SO_4$) and evaporated to give 4.3 g (88%) of ferrocene containing hydroxyl terminated prepolymer, FcOH. $^1H$ NMR of this compound showed an average molecular weight of ~3600. $^1H$ NMR δ: 4.83 (s, 4H), 4.40 (s, 4H), 4.24 (t, 4H), 3.68 (t, 0.43H), 1.78 (m, 4H), 1.52 (m, 4H). IR ($cm^{-1}$, neat): 1722.9 (C=O), 2940.4 (CH aliphatic), 3486.7 (OH). The $^1H$ NMR spectra were obtained with a BRUKER AMX-360 NMR spectrometer (Bruker, Billerica, Mass.) in $CDCl_3$. The IR spectra were recorded on a NICOLET system 550 (Magna series) FTIR spectrometer (Thermo Nicolet, Madison, Wis.). A scheme for the synthesis of the ferrocene-containing hydroxyl terminated (FCOH) prepolymer is shown in FIG. 8.

EXAMPLE 2

FCOH-Containing Block Copolyurethanes

Block copolymers were prepared by using the "prepolymer method." The diisocyanate-terminated prepolymer (BAYTEC ME-080, Bayer Corporation, Pennsylvania) was heated at 100–110° C. for about 30 minutes (diphenylmethane-4,4'-diisocyanate (MDI)/polytetramethylene ether glycol (PTMEG) based BAYTEC ME-080 prepolymers, with NCO content of 8.64%). To this, FcOH dissolved in tetrahydrofuran (THF) and several drops of T-12 catalyst solution (dibutyltin dilaurate) were added. The mixture was mechanically stirred under nitrogen for 20 minutes, and then HDO was added and stirred for one minute. The films were cast from THF, on TEFLON sheets, and were cured under vacuum at 80° C. for 6 hours.

EXAMPLE 3

Ferrocene-Containing Amine Terminated ($FcNH_2$) Prepolymer Synthesis

Figure 9:
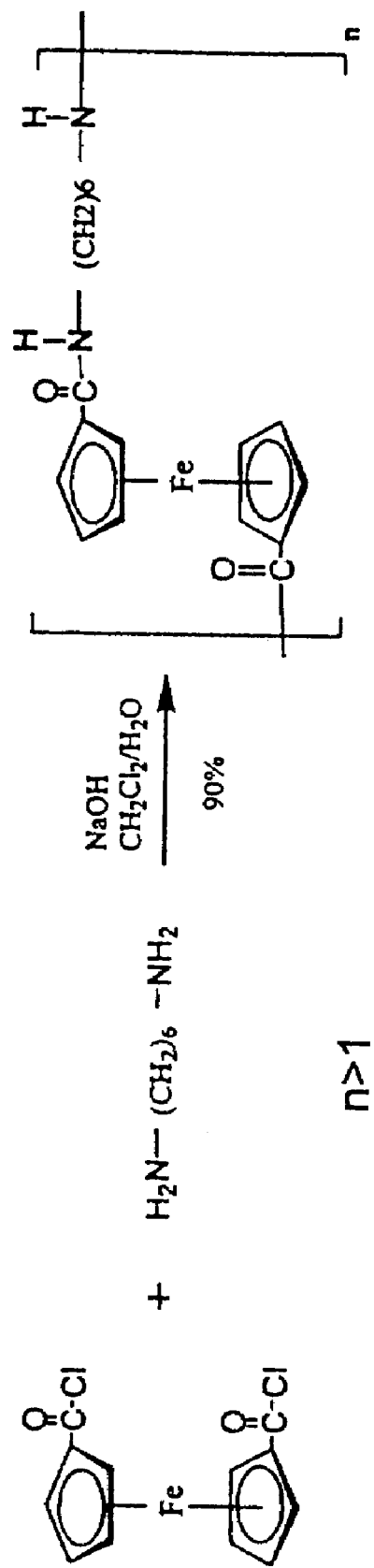
FIG. 9 shows a scheme for the synthesis of ferrocene-containing amine terminated (FcNH$_2$) prepolymer.

To the solution of 7.0 g (0.023 mole) 1,1'-di(chlorocarbonyl) ferrocene in $CH_2Cl_2$ (70 ml), 3.1 g (0.027 mole) 1,6-hexanediamine and 1.8 g (0.045 mole) NaOH dissolved in $H_2O$ (30 ml) was added at one portion and stirred vigorously for 10 minutes. The precipitate was filtered and washed with $CH_2Cl_2$ to give 9.0 g (93%) of $FcNH_2$. Molecular weight by end group analysis was 1381. IR ($cm^{-1}$, KBr pellet): 1551 (amide II band), 1637.3 (amide I band), 2868.0 and 2940 (CH aliphatic), 3091.8 (CH olefin), 3309.0 (NH). A scheme for the synthesis of ferrocene-containing amine terminated ($FcNH_2$) prepolymer is shown in FIG. 9.

EXAMPLE 4

$FCNH_2$-Containing Block Copolyurethanes

Using the "prepolymer method," first the diisocyanate prepolymer ME-080 was heated at 100–100° C. for about 30 minutes. To this, HDO was added and stirred for one minute. Immediately, $FcNH_2$ oligomer dissolved in dimethylacetamide (DMAC) was added and the mixture was stirred for one minute in an ice bath. The films were cast from THF/DMAC, on TEFLON sheets and were cured overnight under vacuum at 80° C.

EXAMPLE 5

ESD Behavior of Ferrocene-Modified Polyurethanes, an Unmodified Polyurethane, and a Polyurethane Containing Ferrocene as an Additive A tribolelectrostatic test device was used to evaluate the electrostatic properties of the ferrocene-modified block copolyurethane embodiments of the subject invention. Specifically, the triboelectrostatic test device was used to evaluate two distinct electrostatic properties of the test materials: (1) the material's capability to develop a charge, which is shown by the peak triboelectric voltage generated (V); and (2) the ability to discharge this surface electrical charge to a grounded frame over time (in seconds), as shown in FIG. 1A. Discharge is best shown by the decay curve and/or the voltage remaining 5 seconds after rubbing has ceased, as shown in FIG. 1B. FIGS. 1A and 1B show the triboelectrostatic test results of an unmodified polyurethane and samples of ferrocene-modified polyurethanes with various percentages of ferrocene-rich prepolymers (FcOH and $FcNH_2$ oligomers) within their backbone structure, and a polyurethane sample with 10% ferrocene as an additive. These test materials were made according to the methods described in Examples 1–4. The charge decay was evaluated after 24 hours of conditioning at 45% relative humidity and 73° F.

The percentages in FIGS. 1A and 1B refer to the percentage of ferrocene-rich prepolymer within the polymeric composition, based on molecular weight. Because each prepolymer included a ferrocene unit and an aliphatic spacer (e.g., hexane diol), the prepolymer was composed of approximately 75% to 80% ferrocene, based on molecular weight. However, the ferrocene prepolymer could include any percentage of ferrocene, preferably from 25% to 100% ferrocene, by molecular weight. Such variables can be readily modified by a person skilled in the art.

The data in FIGS. 1A and 1B show that the incorporation of ferrocene within the structure of the base polymer provides a polymeric composition that exhibits superior and surprising characteristics with regard to ESD behavior, as compared to ferrocene when used as a conductive additive. These data also show that, by changing the percentage of the ferrocene content within the polymer structure, the ordinarily skilled artisan can tailor the polymer to the desired range of surface and volume resistivity.

EXAMPLE 6

Flexible Polyurethane Foam Synthesis by the One-Shot Method

The base material was the BAYFIT 566 A/B system (Bayer Corporation), which is utilized for flexible water-blown polyurethane foams. The BAYFIT 566 Component B (polyol), which contains a mixture of polyether polyols together with 1,4-dioxane (0.000425%), ethylene oxide (0.00085%), formaldehyde (0.000085%), and the blowing agent, water (less than 5%), was stirred for three minutes using a high-speed mechanical stirrer. The hydroxyl number of the polyol mixture was 210. To this, the BAYFIT 566 Component A (polymeric diphenylmethane diisocyanate (MDI), NCO content of 32.5%) was added and stirred for another 5 seconds. For the base material, the mixing ratio of polyol/isocyanate was 100:48 (isocyanate index of 100%). The mixture was then poured into a preheated (120° F.) aluminum mold (9"×8"×4" or 16"×4"×¾"), which was treated with mold release agent, CHEM-TREND MR 515 (Chem-Trend, Howell, Mich.). The foam was removed from the mold after 4–5 minutes and crushed to remove trapped carbon dioxide. For chemically reactive additives, their hydroxyl numbers were used to calculate the correct amount of Component A so the NCO index was 100%. The additives, surfactant, and catalysts were first mixed with the polyol(s) for 3 minutes before adding Component A.

For addition of FcOH from 0.75 pbw to 3 pbw, DABCO DC2585 surfactant (2 pbw) (Dabco, Allentown, Pa.) was added for optimum foam formation. For higher concentrations of FcOH (6.4 pbw), it was necessary to increase the amount of surfactant to 5.4 pbw in order to get good cell structure.

The process for elastomers previously described can be used for films simply by casting a film rather than a block. During the process of casting the film, the ferrocene block will microphase segregate and come to the surface, yielding a ferrocene-rich surface. The ferrocene oligomers could also be used in urethane coatings. In this case, reformulation would be required to accommodate the ferrocene-containing oligomer.

EXAMPLE 7

Star Polymers

Star polymers are characterized by having three or more polymeric arms radiating from a central core. The central core can be a single moiety or monomeric unit (as a dendrimer), or a main chain of monomeric units (the same or different), with the polymeric arms radiating outward in a comb-like fashion. One skilled in the art can synthesize star polymers (also known as star-branched or radial polymers), from a variety of starting materials and techniques, such as condensation or stepgrowth polymerization reactions. These polymers are usually formed by using either multifunctional initiators, multifunctional chain transfer agents, or multifunctional coupling agents. Methods for synthesizing star polymers are disclosed in U.S. Pat. No. 6,177,540.

Metallocene moieties, such as ferrocene, can be incorporated as a constituent into the star polymers using a variety of functionalities, including amine, carboxylic acid, or hydroxyl end groups. For example, one may use monofunctional ferrocene as the final step to place ferrocene at the end of the star polymer's radiating "arms" or "branches," or difunctional ferrocene or ferrocene oligomers can be incorporated as a constituent of one or more of the star polymer's arms.

Figure 10B:
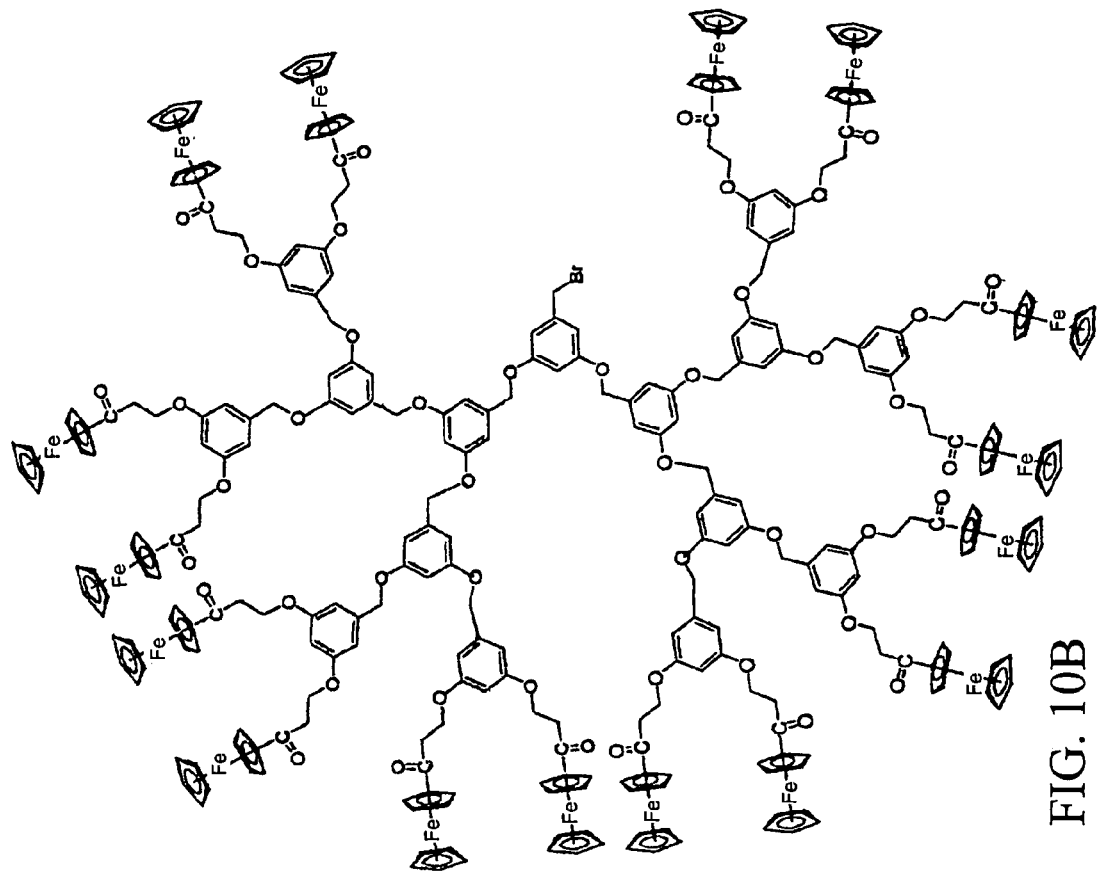
FIG. 10B shows an expanded embodiment of a ferrocene star polymer.
Figure 10A:
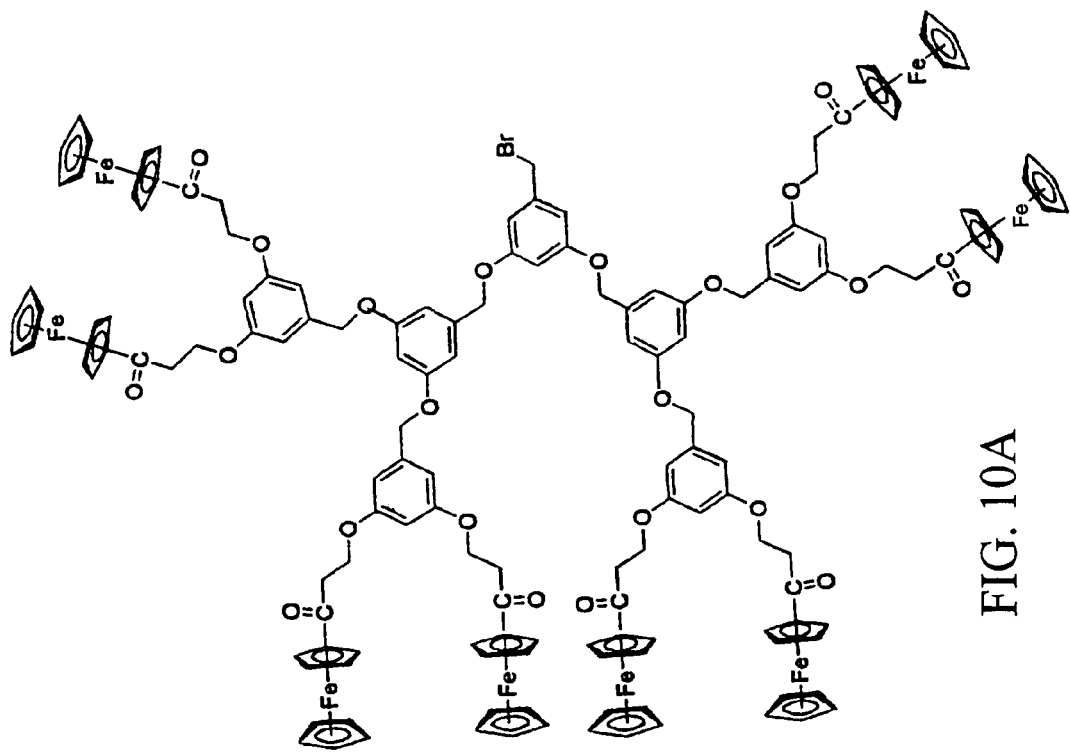
FIG. 10A shows one embodiment of a ferrocene star polymer.

FIGS. 10A and 10B show examples of star polymers. The star polymer shown in FIG. 10B represents an expanded or higher-order version of the star polymer of FIG. 10A, having extended branches and additional ferrocene moieties. Complex networks of linked star polymers are contemplated within the subject invention.

It should be understood that the examples and embodiments described herein are for illustrative purposes only and that various modifications or changes in light thereof will be suggested to persons skilled in the art and are to be included within the spirit and purview of this application and the scope of the appended claims.

REFERENCES

U.S. Pat. No. 4,288,352
U.S. Pat. No. 4,634,865
U.S. Pat. No. 4,804,582
U.S. Pat. No. 5,232,775
U.S. Pat. No. 5,736,469
U.S. Pat. No. 5,955,526
U.S. Pat. No. 6,177,540
Abd-Alla, M. M., El-Zohry, M. F., Aly, K. I., Abd-El-Wahab, M. M. M., "Arylidene Polymers. XVIII. Synthesis and Thermal Behavior of Organometallic Arylidene Polyesters Containing Ferrocene Derivatives in the Main Chain," *J. Applied Polymer Science,* 47:323–29 (1993)
Casado, C. M., Morán, M., Losada, J., and Cuadrado, I., "Siloxane and Organosilicon Dimers, Monomers, and Polymers with Amide-Linked Ferrocenyl Moieties. Synthesis, Characterization, and Redox Properties," *Inorg. Chem.* 34:1668–80 (1995)
Gonsalves, K. E.; Rausch, M. D. (I), "Segmented Poly(ether Urethane) Films Containing Ferrocene Units in the Hard Segments," *J. Polymer Science: Part A: Polymer Chem.,* 24:1599–1607 (1986)
Gonsalves, K., Zhan-ru, L., Rausch, M. D. (II), "Ferrocene-Containing Polyamides and Polyureas," *J. Am. Chem. Soc.* 106:3862–3 (1984)
Hale, P. D., Inagaki, T., Karan, H. I., Okamoto, Y., Skotheim, T. A., "A New Class of Amperometric Biosensor Incorporating a Polymeric Electron-Transfer Mediator," *J. Am. Chem. Soc.* 111:3482–84 (1989)
Kishore, K., Kannan, P., and Iyanar, K., "Synthesis, Characterization, and Fire Retardancy of Ferrocene Containing Polyphosphate Esters," *J. Polymer Science. Part A: Polymer Chem.,* 29:1039–44 (1991)
Najafi-Mohajeri, N.; Nelson, G. L.; Benrashid, R., "Synthesis and Properties of New Ferrocene-Modified Urethane Block Copolymers," *J. Applied Polymer Science,* 76:1847–56 (2000)
Najafi-Mohajeri, N., "New Polyurethane Block Copolymers Containing a Ferrocene Moiety: Synthesis, Characterization, Thermal, and Flammability Properties" (May 1999) (Ph.D. dissertation, Florida Institute of Technology (Melbourne, Fla.)
Wright, M. E., Toplikar, E. G. (I), "Organometallic Nonlinear Optical Polymers. 2. Synthesis of Main-Chain Organometallic Polymers and a Structural Study of Ferrocene NLO-phores," *Macromolecules* 25:6050–54 (1992)
Wright, M. E., Sigman, M. S. (II), "Organometallic Nonlinear Optical Polymers. 3. Copolymerization of Bridged Bis(ferrocenyl) and Bis(cyanoacetate) Monomers via the Knoevenagel Condensation," *Macromolecules* 25:6055–58 (1992)

We claim:

1. A method for modifying the electrostatic dissipative characteristics of a substrate comprising applying a polymer to the substrate, wherein the polymer has metallocene moieties as constituents of the polymer structure, wherein the metallocene moieties are of sufficient proximity to one another within the polymer structure so as to interact and promote charge propagation, wherein the content of metallocene within the polymer structure is from about 1% to about 10% by molecular weight, and wherein the charge buildup of the substrate is decreased and the charge dissipation of the substrate is increased by said applying of the polymer; and wherein the metallocene moieties are pendant from the polymer backbone.

2. The method according to claim 1, wherein each of the metallocene moieties contains a metal atom selected from the group consisting of iron, molybdenum, ruthenium, osmium, nickel, vanadium, rhenium, and technetium.

3. The method according to claim 1, wherein at least one of the metallocene moieties is a ferrocene moiety.

4. The method according to claim 1, wherein each of the metallocene moieties is linked to another constituent of the polymer structure by two functionalities.

5. The method according to claim 1, wherein the polymer is selected from the group consisting of a polyolefin, polyurea, polyurethane, polyester, and polyamide.

6. The method according to claim 1, wherein the polymer is a copolymer of a type selected from the group consisting of random, alternating, graft, and block.

7. The method according to claim 1, wherein the polymer is a block copolymer.

8. The method according to claim 1, wherein the polymer is applied to the substrate as a polymeric composition comprising the polymer and an additive.

9. The method according to claim 8, wherein the additive is selected from the group consisting of a heat stabilizer, filler, pigment, colorant, lubricant, fire retardant, antioxidant, ultraviolet inhibitor, and processing aid.

10. The method according to claim 1, wherein the substrate is constructed of one or more materials selected from the group consisting of metal, wood, fabric, concrete, particle board, and a polymer material.

11. The method according to claim 1, wherein the substrate is an article selected from the group consisting of a floor surface, textile fabric, floor covering, pillow, stretcher pad, seat covering, adhesive tape, garment, wipe, swab, pen, furniture, conveyor means, delivery truck, delivery cart, tool, packaging, container, machine casing, machine cover, electronic component carrier, wafer boat, wafer jar, battery, antenna, transistor, and printer component.

12. The method according to claim 1, wherein the substrate is a computer component selected from the group consisting of a computer casing, circuit board, through-hole plating of a circuit board, microprocessor, random access memory component, read only memory component, disc drive, electrode, and lithographic resist.

13. The method according to claim 1, wherein the substrate is an article selected from the group consisting of a fuel pump, fuel pump handle, hose, hose covering, fuel pump wand, fuel pump nozzle, and fuel piping component.

14. The method according to claim 1, wherein the substrate is an article selected from the group consisting of vehicle seat upholstery, exterior vehicle paneling, interior vehicle paneling, and vehicle console component.

15. The method according to claim 1, wherein the substrate is an article selected from the group consisting of a gasket, seal, o-ring, diaphragm, gear, valve, bushing, bumper, grommet, stopper, bellows, plug, vibration mount, veering, weather stripping, roller, and tubing connector.

16. The method according to claim 1, wherein the metallocene moieties are separated from one another within the polymer structure by six to twelve intervening atoms.

17. The method according to claim 1 wherein the polymer is applied to the substrate as a coating.

18. The method according to claim 1, wherein the substrate is an article of manufacture.

19. The method according to claim 1, wherein the substrate is a polymer.

20. An article of manufacture comprising a polymer, wherein said polymer has metallocene moieties as constituents of the polymer structure, wherein the metallocene moieties are of sufficient proximity to one another within the polymer structure so as to interact and promote charge propagation, and wherein the content of metallocene within the polymer structure is from about 1% to about 10% by molecular weight; and wherein the metallocene moieties are pendant from the polymer backbone.

21. The article of manufacture of claim 20, wherein said polymer is electrostatic dissipative.

22. The article of manufacture of claim 20, wherein each of said metallocene moieties contains a metal atom selected from the group consisting of iron, molybdenum, ruthenium, osmium, nickel, vanadium, rhenium, and technetium.

23. The article of manufacture of claim 20, wherein said metallocene moieties include at least one ferrocene moiety.

24. The article of manufacture of claim 20, wherein said article is selected from the group consisting of a floor surface, textile fabric, floor covering, pillow, stretcher pad, seat covering, adhesive tape, garment, wipe, swab, pen, furniture, conveyor means, delivery truck, delivery cart, tool, packaging, container, machine casing, machine cover, electronic component carrier, wafer boat, wafer jar, battery, antenna, transistor, and printer component.

25. The article of manufacture of claim 20, wherein said article is a computer component selected from the group consisting of a computer casing, circuit board, through-hole plating of a circuit board, microprocessor, random access memory component, read only memory component, disc drive, electrode, and lithographic resist.

26. The article of manufacture of claim 20, wherein said article is selected from the group consisting of a fuel pump, fuel pump handle, hose, hose covering, fuel pump wand, fuel pump nozzle, and fuel piping component.

27. The article of manufacture of claim 20, wherein said article is selected from the group consisting of vehicle seat upholstery, exterior vehicle paneling, interior vehicle paneling, and vehicle console component.

28. The article of manufacture of claim 20, wherein said article is selected from the group consisting of a gasket, seal, o-ring, diaphragm, gear, valve, bushing, bumper, grommet, stopper, bellows, plug, vibration mount, veering, weather stripping, roller, and tubing connector.

29. The article of manufacture of claim 20, wherein the metallocene moieties are separated from one another within the polymer structure by six to twelve intervening atoms.

30. The article of manufacture of claim 20, wherein said polymer has been manipulated to form a shape.

31. A method for modifying the electrostatic dissipative characteristics of a substrate comprising applying a polymer to the substrate, wherein the polymer has metallocene moieties as constituents of the polymer structure, wherein the metallocene moieties are of sufficient proximity to one another within the polymer structure so as to interact and promote charge propagation, wherein the content of metallocene within the polymer structure is from about 1% to about 10% by molecular weight, wherein the charge buildup of the structure is decreased and the charge dissipation of the substrate is increased by said applying of the polymer, and wherein each of the metallocene moieties is linked to another constituent of the polymer structure by a single functionality.

32. The method according to claim 31, wherein each of the metallocene moieties contains a metal atom selected from the group consisting of iron, molybdenum, ruthenium, osmium, nickel, vanadium, rhenium, and technetium.

33. The method according to claim 31, wherein at least one of the metallocene moieties is a ferrocene moiety.

34. The method according to claim 31, wherein the substrate is constructed of one or more materials selected from the group consisting of metal, wood, fabric, concrete, particle board, and a polymer material.

35. The method according to claim 31, wherein the polymer is selected from the group consisting of a polyolefin, polyurea, polyurethane, polyester, and polyamide.

36. The method according to claim 31, wherein the substrate is an article selected from the group consisting of a floor surface, textile fabric, floor covering, pillow, stretcher pad, seat covering, adhesive tape, garment, wipe, swab, pen, furniture, conveyor means, delivery truck, delivery cart, tool, packaging, container, machine casing, machine cover, electronic component carrier, wafer boat, wafer jar, battery, antenna, transistor, printer component, fuel pump, fuel pump handle, hose, hose covering, fuel pump wand, fuel pump nozzle, fuel piping component, vehicle seat upholstery, exterior vehicle paneling, interior vehicle paneling, vehicle console component, gasket, seal, o-ring, diaphragm, gear, valve, bushing, bumper, grommet, stopper, bellows, plug, vibration mount, veering, weather stripping, roller, and tubing connector.

37. The method according to claim 31, wherein the substrate is a computer component selected from the group consisting of a computer casing, circuit board, through-hole plating of a circuit board, microprocessor, random access memory component, read only memory component, disc drive, electrode, and lithographic resist.

38. The method according to claim 31, wherein the polymer is applied to the substrate as a polymeric composition comprising the polymer and an additive.

* * * * *